(12) United States Patent
Hayashi et al.

(10) Patent No.: US 6,418,062 B1
(45) Date of Patent: Jul. 9, 2002

(54) ERASING METHODS BY HOT HOLE INJECTION TO CARRIER TRAP SITES OF A NONVOLATILE MEMORY

(75) Inventors: Yutaka Hayashi, Tsukuba (JP); Seiki Ogura, Wappingers Falls, NY (US); Tomoya Saito, Ohtsu (JP)

(73) Assignee: Halo LSI, Inc., Wapperings Falls, NY (US)

( * ) Notice: Subject to any disclaimer, the term of this patent is extended or adjusted under 35 U.S.C. 154(b) by 0 days.

(21) Appl. No.: 09/795,186

(22) Filed: Mar. 1, 2001

(51) Int. Cl.[7] .............................................. G11C 11/34
(52) U.S. Cl. .............................. 365/185.29; 365/185.18
(58) Field of Search ......................... 365/185.29, 185.18

(56) References Cited

U.S. PATENT DOCUMENTS 5,894,438 A * 4/1999 Yang et al. ............. 365/185.18
6,255,166 B1 * 7/2001 Ogura et al. ................. 438/257

FOREIGN PATENT DOCUMENTS

JP 0186293 * 11/1982 ........... G11C/17/00

OTHER PUBLICATIONS

Betty Prince, "Semiconductor Memories", 1983, Wiley, 2nd pp. 141–142.*
E. Suzuki, et al., "A Low–Voltage Alterable EEPROM with Metal–Oxide–Nitride–Oxide–Semiconductor (MONOS) Structure", *IEEE Transaction on Electron Devices*, vol. ED–30, Feb. 1983, pp. 122–128.

T.Y. Chan et al., "A True Single–Transistor Oxide–Nitride Oxide EEPROM Device", *IEEE Electron Device Letters*, vol. EDL–8, No. 3, 1987, pp. 93–95.

Y. Tarui et al., "Electrically Reprogrammable Nonvolatile Memory," *IEEE Journal of Solid–State Circuits*, vol. SC–7, No. 5, Oct., 1992, pp. 369–375.

B.E. Tan, et al., "CanNROM, a 2 Bit Trapping Storage NVM Cell Give a Real Challenge to Floating Gate Cells?", 1999 *Conference on Solid State Devices*, and Materials, Tolyo, Extended Abstracts, pp. 522–523, 1999.

* cited by examiner

*Primary Examiner*—M. Tran
(74) *Attorney, Agent, or Firm*—George O. Saile; Stephen B. Ackerman; Rosemary L. S. Pike (57) ABSTRACT

A method of stably and uniformly erasing a non-volatile memory or memory array in a gate insulator in which carrier-trapping sites for carrier storage are furnished is described. A first method of the invention is the application of a discharge pulse(s) to a gate after erasure where the discharge pulse(s) discharges unstable holes injected into the gate insulator. A second method of the invention is injection of electrons into the trap sites of all the cells in a memory array to be erased before erasure. This makes $V_{th}$ distribution across the memory array uniform after erasure. A third method of the invention is a reduced bias approach to erase stably the electrons stored in the trap sites. This includes not only literally "erase," but also "annihilate or neutralize" trapped electron charge by hole charge.

113 Claims, 2 Drawing Sheets

ERASING METHODS BY HOT HOLE INJECTION TO CARRIER TRAP SITES OF A NONVOLATILE MEMORY

BACKGROUND OF THE INVENTION

1. Field of the Invention

The present invention relates to erasing methods of a nonvolatile memory cell and array using hot holes.

2. Description of the Prior Art

MONOS (Metal-Oxide-Nitride-Oxide-Semiconductor, in which "Metal" is a representative of a conducting gate material) or SONOS (Silicon (as a conductive gate)-Oxide-Nitride-Oxide-Silicon) memories have been proposed for the improvement of MONOS (Metal-Nitride-Oxide-Semiconductor) memory in scaling down the thickness of the nitride film for the device scaling in the lateral dimension and scaling in the programming voltage and also for improvement in reproducibility. In the MONOS or SONOS memory (hereinafter "MONOS memory" will be used to represent both), carrier trap sites, which are located in the nitride film and at the interface between the nitride and the top oxide, are used for capturing and storing carriers as electrical information.

In an original MONOS paper (Reference 1: E. Suzuki, et al., "A Low-Voltage Alterable EEPROM with metal-oxide-nitride-oxide-semiconductor (MONOS) Structure", *IEEE Transaction on Electron Devices*, Vol. ED-30, February. 1983), direct tunneling of electrons and holes is used for the programming; that is, direct-tunnel injection of electrons into the trap sites is used for "write" and direct-tunnel extraction of electrons from the trap sites and/or direct-tunnel injection of holes into the trap sites is used for "erase."

On the other hand, injection of hot electrons into the trap sites for write and erasure by the injection of hot holes, which was originally applied to a floating gate device (see Reference 2: Y. Tarui, Y. Hayashi, K. Nagai, "Electrically Reprogrammable Nonvolatile Memory," *IEEE Journal of Solid-State Circuits*, Vol.SC-7, No.5, October., 1992, p.369–375), was proposed for programming single gate MONOS memories with thicker bottom oxide for better retention characteristics (see Reference 3: T.Y. Chan, K. K. Young, Chemning Hu, "A True Single-Transistor Oxide-Nitride-Oxide EEPROM Device", *IEEE Electron Device Letters*, Vol.EDL-8, No.3, 1987, p.93–95) and for doubling bit density (see Reference 4: B. Eitan, et al., "Can NROM, a 2 Bit, Trapping Storage NVM Cell, Give a Real Challenge to Floating Gate Cells?", 1999 *Conference on Solid State Devices and Materials*, Tokyo, Extended Abstracts, p. 522–523, 1999).

The above single gate MONOS memory is characterized by a single gate bridging over a channel region where the single gate is disposed on ONO (oxide-nitride-oxide) gate insulator on the channel forming semiconductor region and on a part of the drain and source region.

For the "write," hot electrons are injected into a part of the ONO gate insulator adjacent to a junction between the drain and the channel forming region and trapped in the trapping sites in the ONO gate insulator. For the "erase," hot holes are injected into a part of the ONO gate insulator adjacent to the junction. However, erased states by hot holes turned out to be not reproducible and/or not stable with respect to the threshold voltage ($V_{th}$) under certain hole injection bias conditions. In References 3 and 4, above, this instability was masked by stable electrical characteristics of a portion of the channel forming semiconductor region under an un-programmed portion of the ONO film because a portion of the channel forming semiconductor region under an erased portion of the ONO film is connected in series with the above "unprogrammed" portion of the channel forming semiconductor region, where $V_{th}$ is higher than the $V_{th}$ of the "erased" portion. On the other hand, the instability will be observed if the majority of the un-programmed portion of the channel forming semiconductor region is controlled and turned on by a separate gate. In this case, another gate is laid side by side with and insulated from the separate gate disposed over the programmed portion of the channel forming semiconductor region.

SUMMARY OF THE INVENTION

It is a purpose of the present invention to provide a method of stably erasing a non-volatile memory in a gate insulator in which carrier-trapping sites for carrier storage are furnished.

It is another object of the present invention to provide a method of uniformly erasing a non-volatile memory array with a gate insulator in which carrier-trapping sites for carrier storage are furnished.

It is a further object of the invention to provide a method of erasing to realize better endurance of a non-volatile memory.

Accordingly, a first method of the present invention is the application of a discharge pulse(s) to a gate after erasure where the discharge pulse(s) discharges unstable holes injected into the gate insulator. Hot holes are injected into a gate insulator while negatively or zero biasing a conductive gate and positively biasing an opposite conductivity region whereby hot holes are generated in a surface of the opposite conductivity region, wherein positively biasing the opposite conductivity region with respect to a first channel forming semiconductor region is larger in value than an electric barrier height against the hot holes wherein the electric barrier is formed at an interface between the gate insulator and the opposite conductivity region. The conductive gate is positively biased to a voltage which generates an average electric field of more than 5 MV/cm in the first gate insulator.

A second method of the invention is injection of electrons into the trap sites of all the cells in a memory array to be erased before erasure. This makes $V_{th}$ distribution across the memory array uniform after erasure. Electrons are injected into a gate insulator wherein the electrons are trapped in carrier trap sites within the gate insulator. Then, hot holes are injected into the gate insulator while applying a negative or zero bias to a conductive gate and applying a positive bias to an opposite conductivity region.

A third method of the invention is a reduced bias approach to erase stably the electrons stored in the trap sites. Hot holes are injected into a gate insulator while applying a negative or zero bias to a conductive gate and applying a positive bias to an opposite conductivity region wherein the positive bias is larger in value than an electric barrier height against the hot holes, wherein the electric barrier is formed at an interface between the gate insulator and the opposite conductivity region and wherein a sum of absolute values of the positive bias and ⅔ of the negative or zero bias is equal to or smaller than 6V wherein the negative or zero bias ranges from 0V to −5V. This includes not only literally "erase," but also "annihilate or neutralize" trapped electron charge by hole charge.

At least one of the above methods is applied to a memory cell or a memory array made from memory cells where the memory cell comprises at least:

a) a first channel forming semiconductor region in a surface of a substrate,
b) an opposite conductivity type region adjacent to the first channel forming semiconductor region and in the surface of the substrate,
c) a gate insulator on the first channel forming semiconductor region,
d) a conductive gate on the gate insulator and carrier trap sites in the gate insulator,
e) a second channel forming semiconductor region contacting the first channel forming semiconductor region in the surface of the substrate,
f) a second gate insulator on the second channel forming semiconductor region, and
g) a second gate on the second gate insulator where the second conducting gate is separated and insulated from the first conducting gate by an insulator.

More specifically, the memory cell comprises:
a) a channel forming semiconductor region of one conductivity type in a surface of a substrate where the substrate is a semiconductor substrate or a silicon-on-insulator (SOI) substrate,
b) a first opposite conductivity region and a second opposite conductivity region being disposed in the surface of the substrate where the first and second opposite conductivity regions are spaced apart and separated from each other by the channel forming semiconductor region,
c) the channel forming semiconductor region comprises:
  i) a first channel-forming region laterally contacting the first opposite conductivity region,
  ii) a second channel forming region contacting the second opposite conductivity region, and
  iii) a third channel forming region in contact with the first and second channel forming regions and disposed between the first channel forming region and the second channel forming region,
d) gate insulators comprising:
  i) a first gate insulator disposed on the first channel forming region and a part of the first opposite conductivity region adjacent to the first channel forming region,
  ii) a second gate insulator disposed on the second channel forming region and a part of the second opposite conductivity region adjacent to the second channel forming region, and
  iii) a third gate insulator disposed on the third channel forming region,
e) conductive gates comprising:
  i) a first gate electrode on the first gate insulator,
  ii) a second gate electrode on the second gate insulator, and
  iii) a third gate electrode on the third gate insulator
wherein the gate electrodes are electrically insulated from each other and wherein a part of the first gate overlaps a part of the first opposite conductivity region via the first insulator and a part of the second gate overlaps a part of the second opposite conductivity region via the second insulator, and
f) carrier trapping sites for carrier storage furnished in the first and second insulators.

As one example, the carrier trapping sites are embedded in a three layered insulator structure. A typical embodiment is an oxide-nitride-oxide layer, where, in the fabrication process, carrier trapping sites are generated in the silicon nitride and/or in the interface between the silicon nitride and the silicon oxide. The silicon nitride can include a fraction of oxygen and the silicon oxide can be a nitrided oxide in which a part of the oxygen atoms of the oxide are replaced by nitrogen atoms.

As another example, the carrier trapping sites are realized by small particles of conductor or semiconductor such as silicon buried in the first and second gate insulators.

DETAILED DESCRIPTION OF THE PREFERRED EMBODIMENTS

Figure 1:
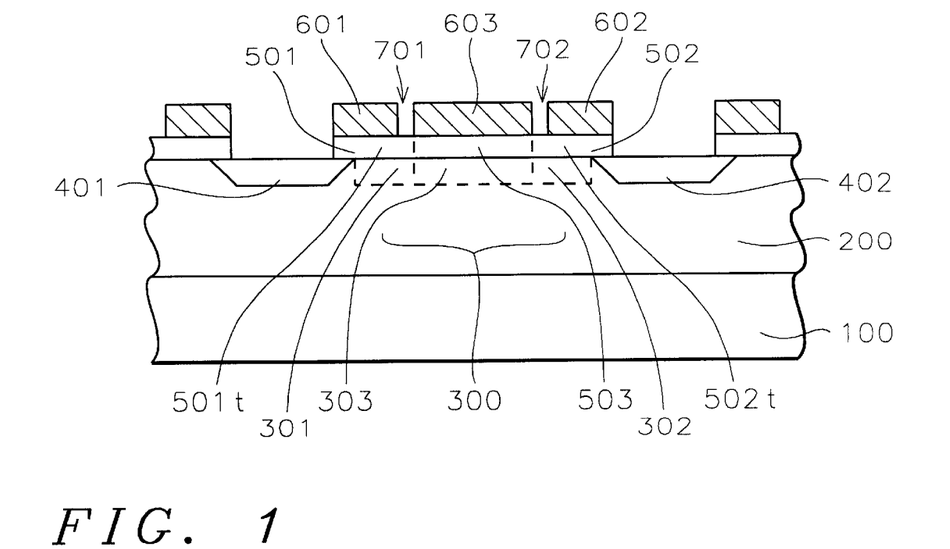
FIG. 1 is a cross-sectional representation of an example of a non-volatile memory cell to which the hole injection erasing method of the present invention is applied.

FIG. 1 shows an example of a non-volatile memory cell to which the hole injection methods of the present invention are applied. It will be understood by those skilled in the art that the methods of the present invention can be applied to other suitable non-volatile memory cells than the one shown in FIG. 1 without departing from the spirit and scope of the present invention.

In the surface of a semiconductor substrate 100, a well region 200 is formed. In the surface of the well region 200, a channel forming semiconductor region 300, a first opposite conductivity region 401, and a second opposite conductivity region 402 are formed. The channel forming semiconductor region 300 is of p-type and the first and second opposite conductivity regions are of n-type.

The channel forming semiconductor region 300 further comprises:
a) a first channel forming region 301 contacting the first opposite conductivity region 401,
b) a second channel forming region 302 contacting the second opposite conductivity region 402, and
c) a third channel forming region 303 contacting the first and second channel forming regions at both sides.

A first gate insulator 501 is disposed on the first channel forming region 301 and a part of the first opposite conductivity region 401 adjacent to the first channel forming region. A second gate insulator 502 is disposed on the second channel forming region 302 and a part of the second opposite conductivity region 402 adjacent to the second channel forming region. A third gate insulator 503 is disposed on the third channel forming region 303.

A first gate electrode 601 is formed on the first gate insulator 501. A second gate electrode 602 is formed on the second gate insulator 502. A third gate electrode 603 is formed on the third gate insulator 503. The first and third gate electrodes and the second and third gate electrodes are electrically insulated from each other by insulators 701 and 702.

A part of the first gate electrode 601 overlaps a part of the first opposite conductivity region 401 via the first insulator 501 and a part of the second gate electrode 602 overlaps a part of the second opposite conductivity region 402 via the second insulator 502.

For example, a channel length of the third channel forming region 303 is 0.26 micrometers. Channel lengths of the first and second channel forming regions are each 0.055 micrometers. Impurity concentrations of the first and second channel forming regions are about 1E18 atoms/cm$^2$ near the surface. Impurity concentrations of the first and second opposite conductivity regions are between about 1E19 and 1E20 atoms/cm$^2$ near the surface under the first and second gates, respectively. The third gate insulator is silicon oxide with a thickness of about 9 nanometers. The first and second gate insulators comprise three layers: 3.6 nm nitrided silicon oxide/5 nm silicon nitride/4.2 nm silicon oxide.

Two groups of carrier trapping sites 501t and 502t are located in the silicon nitride with the concentration on the order of 1E 19 sites/cm$^3$ and at the interface of the silicon nitride and the silicon oxide and the interface of the silicon nitride and the nitrided silicon oxide with a density of about 2E13 sites/cm$^2$.

Now, the stable erasing methods by hot hole injection of the present invention will be described with reference to the memory cell illustrated in FIG. 1.

Hot hole injection into the first insulator 501 from the first opposite conductivity region 401 is made by applying a positive electrical potential Vbit1r (larger than an electric barrier height against a hole, $V_{Bh}$) to the first opposite conductivity region 401 with respect to the first channel forming region 301 and applying a zero to negative potential Vcg1 to the first gate electrode 601 with respect to the first channel forming region 301. Hot hole injection into the second insulator 502 from the second opposite conductivity region 402 is made by applying a positive electrical potential Vbit2r (larger than an electric barrier height against a hole, $V_{Bh}$) to the second opposite conductivity region 402 with respect to the second channel forming region 302 and applying a zero to negative potential Vcg2 to the second gate electrode 602 with respect to the second channel forming region 302.

The holes to be injected are generated by band to band tunneling in the surface of the first or second opposite conductivity type region (401 and 402, respectively). The abovementioned "electric barrier height against a hole $V_{Bh}$" means a value (measured in volts) of electric barrier height against a hole formed between the surface of the first or second opposite conductivity region and the first or second insulator. The electric barrier height against a hole, $V_{Bh}$, is known as 3.8 electron volt (eV) for a barrier between silicon and SiO$_2$. The value is smaller for a nitrided silicon oxide.

Hot electron injection into the first insulator 501 from a first channel in the surface of the first channel forming semiconductor region 301 is made by applying a positive electric potential Vbit1 w (larger than an electric barrier height against an electron, $V_{Be}$) to the first opposite conductivity type region 401 with respect to the first channel forming semiconductor region 301 and by applying a positive potential Vcg1 to the first gate electrode 601 with respect to the first channel forming semiconductor region 301.

The abovementioned "electric barrier height against an electron, $V_{Be}$" means a value (measured in volts) of electric barrier height against an electron formed between the surface of the first or second channel forming semiconductor region and the first or second insulator. The electric barrier height against an electron, $V_{Be}$, is known as 3.2 electron volt (eV) for a barrier between silicon and SiO$_2$. The value is smaller for a nitrided silicon oxide.

Electrons to be injected are supplied to the first channel from the second opposite conductivity type region 402 through a second channel induced in the surface of the second channel forming region 302 and a third channel induced in the surface of the third channel forming region 303. The first, second, and third channels are electrically induced in the respective surfaces of the first, second, and third channel forming semiconductor regions by applying each bias larger than each gate threshold voltage to the first, second, and third gates.

The dimension, impurity concentration, and combination of the material and thicknesses of the gate insulators of the memory cell are not limited to the above example

EXAMPLE

The following Example is given to illustrate the important features of the invention and to aid in the understanding thereof. Variations may be made by one skilled in the art without departing from the spirit and scope of the invention.

A memory cell with the following dimensions and materials is used for one of the embodiments. The peak impurity concentration of the first and second channel forming silicon region is between about 5E17 and 4E18 atoms/cm$^3$. The channel length of the first and second channel forming silicon regions is between about 30 and 80 nm. The impurity concentration of the third channel forming silicon region is between about 5E17 and 1E18 atoms/cm$^3$. The channel length of the third channel forming silicon region is between about 60 and 260 nm. The first and second insulators comprises three layers of ONO; e.g. a bottom layer of nitrided silicon oxide 3.6 to 7 nm thick, a middle layer of silicon nitride 3–9 nm thick, and a top layer of silicon oxide 4–8 nm thick. Alternatively, the ONO layer could comprise a bottom layer of silicon oxide 2.5 to 6 nm thick, a middle layer of silicon nitride 3 to 9 nm thick, and a top layer of silicon oxide 4 to 8 nm thick. The impurity concentration of the first and second opposite conductivity type regions is between about 1E19 to 5E20 atoms/cm$^3$ at each portion under the first and second gates. The insulator between the third gate and the first or second gate at least on each sidewall of the third gate is silicon oxide or nitrided silicon oxide/silicon nitride/silicon oxide.

By using the above described device, hole injection into the ONO of the second (or first) gate insulator was done with various bias conditions (combinations of voltages and time duration) and threshold voltages were measured as gate threshold voltages ($V_{th}$) of the second gate.

Figure 2:
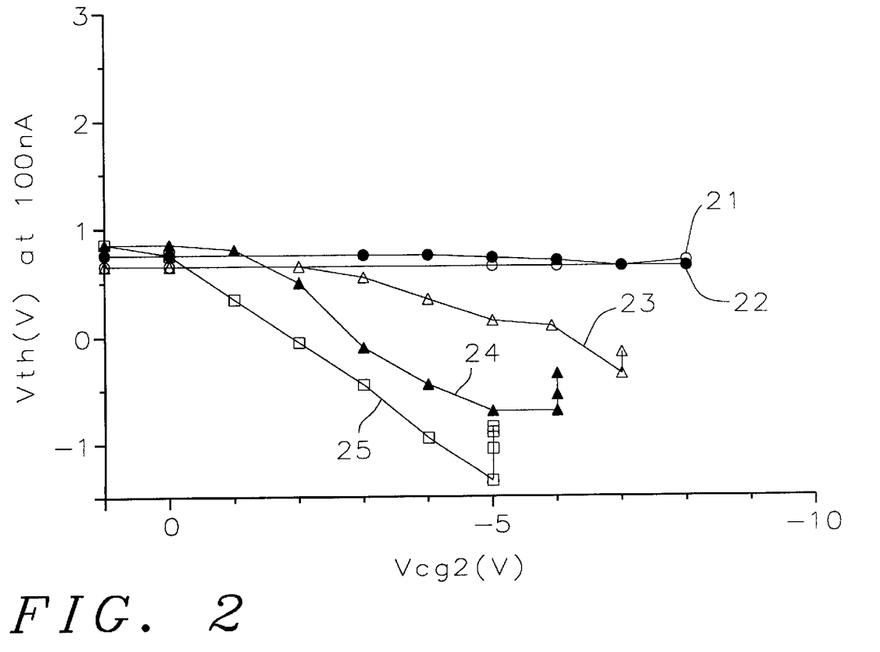
FIG. 2 is a graphical representation of erased threshold voltages versus erase voltages and threshold voltage drifts after each read operation.

FIG. 2 shows results of the hole injection (for an injection time of 100 milliseconds). In the figure, voltage of the second gate is designated Vcg2 and voltage of the second opposite conductivity type region is designated as Vbit2 and represented by the lines, as follows. Line 21 indicates a Vbit2 of 0 volts, line 22, a Vbit2 of 3 volts, line 23, 4 volts, line 24, 5 volts, and line 25, 6 volts.

For Vbit2 equal to or larger than 4 volts, (lines 23, 24, and 25), $V_{th}$ measured as that of the gate threshold voltage of the second gate changes toward the negative direction. This means holes were injected into trap sites in the ONO of the second gate insulator. With larger (Vbit2−Vcg2), the larger value of the change in Vth is obtained. However, too large (Vbit2−Vcg2), more than 10 volts, resulted in a short term instability.

The erased $V_{th}$ with (Vbit2−Vcg2) more than 10 volts showed drift ($V_{th}$=~0.5 V) in values after repetitive measurement for $V_{th}$ detection as shown in FIG. 2, where the drift in erased $V_{th}$ is shown as the change in $V_{th}$ values for (Vbit2−Vcg2)=11 V. To reduce this drift in $V_{th}$, as one of the erasing method of the present invention, application of a stabilizing positive bias, or discharge pulse, after erasure was adopted to the second gate (or to the first gate) with bit line voltage Vbit2 (or Vbit1) of 0V or of less than the electric barrier height against an electron $V_{Be}$. The stabilizing positive bias, (e.g. 5 V which corresponds to an electric field of 5 Mv/cm in the second gate insulator) is larger in the value than a voltage (e.g. 4V) applied to the second gate (or the first gate) when read and is longer than 1 millisecond in duration. The drift in $V_{th}$ when read was reduced less than 0.1 V by this method.

Figure 3:
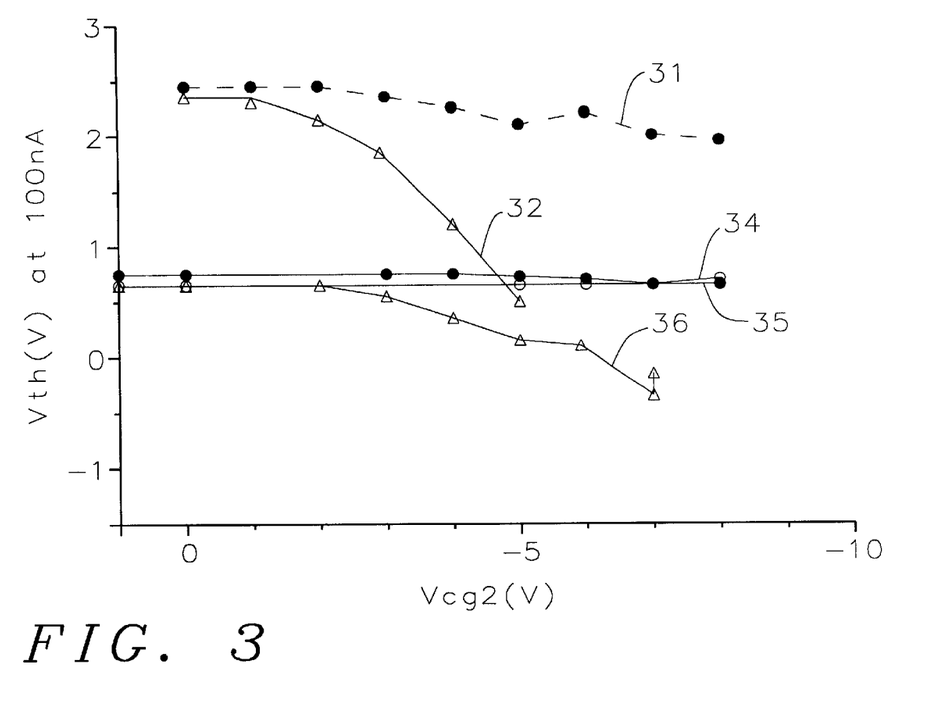
FIG. 3 is a graphical representation of the erased threshold voltages versus erase voltages with high threshold voltage and low threshold voltage before the erase.

FIG. 3 shows differences in erased $V_{th}$ between erased $V_{th}$ erased from a high $V_{th}$ (for Vbit2=3V, line 31 and for Vbit2=4V, line 32) and erased $V_{th}$ erased from a low $V_{th}$ (for Vbit2=0V, line 34, 3V, line 35, and 4V, line 36). As one of the erasing methods of the present invention, the trap sites which locate under the second gate (or the first gate) and are either in high or low $V_{th}$ states, are programmed as a high $V_{th}$ state by electron injection before erasure. A more uniform erased $V_{th}$ distribution across a memory array comprising the present memory cells is obtained.

As described above, the drift in erased $V_{th}$ is pronounced for a larger value of (Vbit2–Vcg2). Endurance, which is defined as how many write-erase cycles a memory cell can stand, is also small for a larger value of (Vbit2–Vcg2). The larger value of (Vbit2–Vcg2) may result in excess holes injected into the trap sites and/or holes unstably captured in trap sites. Furthermore, a larger value of Vbit2 results in holes with a higher energy and brings earlier degradation (i.e. increased leakage in the second gate insulator and poor retention), and finally, loss of memory function of the second gate insulator. On the other hand, a larger value of Vcg2 results in electron injection from the second gate into the second gate insulator through the top oxide. This prevents the erasure by the hot hole injection. The larger value of Vcg2 also induces leakage current through the top oxide, in case the top oxide is deposited by a low temperature chemical vapor deposition (CVD) method or by using an organo-silane as a source gas.

As one of the erasing methods of the present invention, under limited bias conditions characterized as (Vbit2+(⅖)× (–Vcg2)) equal to or smaller than 6V with –Vcg2 equal to or smaller than 5V, more than 1000 cycles of write-erase were obtained. These bias conditions were determined by the abovementioned physics and experiments.

Examples of experimental results on endurance with erase and write conditions are shown in the following Table 1.

TABLE 1

Endurance Data

| Experiment # | Endurance (cycles) | Vbit2 (V) | Vcg2 (V) | write condition |
|---|---|---|---|---|
| 1 | >1000 | 4 | –5 (150 msec) | Vbit2 = 5 V<br>Vco2 = 4.5 V<br>(5 μsec) |
| 2 | >30,000 | 5 | –2.5 (100 msec) | Vbit2 = 4.7 V<br>Vcg2 = 6 V<br>(100 μsec) |
| 3 | >100,000 | 5 | –2 (100 msec) | Vbit – 4.7 V<br>Vcg2 = 6 V<br>(100 μsec) |

Figure 4:
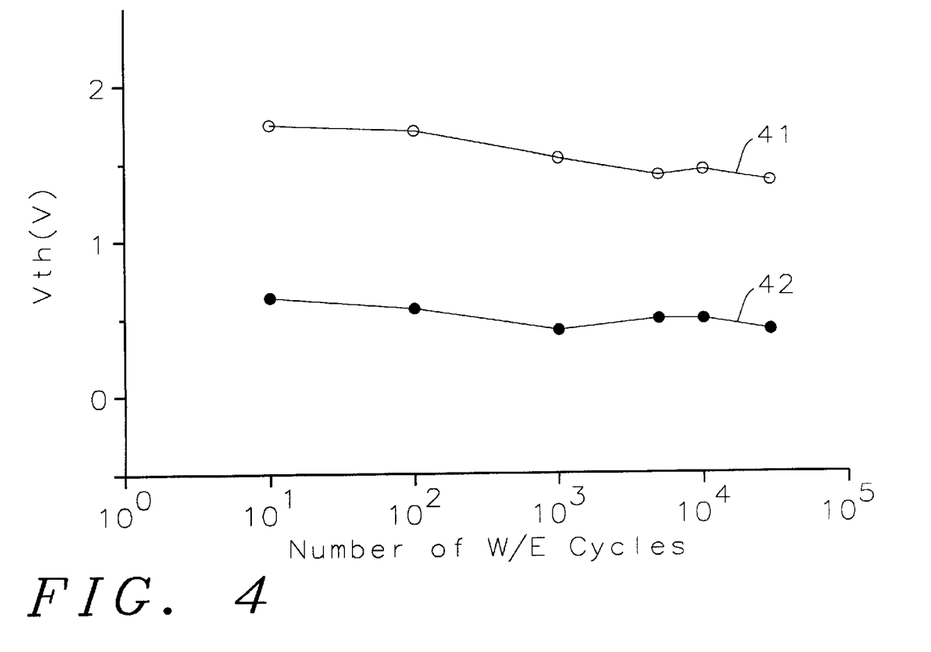
FIG. 4 is a graphical representation of written threshold voltages and erased threshold voltages versus the write-erase cycle.

FIG. 4 shows written $V_{th}$ and erased $V_{th}$ as a function of write-erase cycles. During 30,000-cycle operation, a memory window was kept in a readable width under a constant "write" and "erase" (voltage and time) condition. Line 41 shows the $V_{th}$ for write at 100 μsec and line 42 shows $V_{th}$ an for erase at 100 μsec. The memory cell could be further written and erased.

For erasing trap sites under the first gate, the abovementioned methods can be applied by reading Vbit2 and Vcg2 as Vbit1 and Vcg1, respectively.

The methods of erasing of the present invention comprise:

1) injecting hot holes while negative or zero biasing the conductive gate and positively biasing the opposite conductivity region whereby hot holes are generated in the surface of the opposite conductivity region. The positive biasing of the opposite conductivity region with respect to the channel forming semiconductor region is larger in value than the electric barrier height against the holes where the electric barrier is formed at the interface between the gate insulator and the opposite conductivity region. Then, the conductive gate is positively biased to a voltage which generates an average electric field of more than 5 MV/cm in the gate insulator. Positively biasing the conductive gate is achieved by the application of a discharge pulse to the gate after erasure. The discharge pulse discharges unstable holes injected into the gate insulator.

2) "write before erase" —injecting electrons into the gate insulator where the electrons are trapped in carrier trap sites within the gate insulator and injecting hot holes while negatively or zero biasing the gate electrode and positively biasing the opposite conductivity type region.

3) injecting hot holes while negatively or zero biasing the gate electrode and positively biasing the opposite conductivity type region and generating hot holes in the surface of the opposite conductivity type region by the combination of applying negative or zero bias to the gate electrode and positive bias to the opposite conductivity type region. The positive bias to the opposite conductivity type region with reference to the channel forming semiconductor region is larger in value than an electric barrier height against the holes where the electric barrier is formed at an interface between the gate insulator and the opposite conductivity region. The sum of the absolute values of the positive bias to the opposite conductivity region and ⅖ of the gate bias is equal to or smaller than 6V for the gate bias ranging from 0 V to –5V.

The process of the present invention provides the following advantages:

1) $V_{th}$ drift after erasure is improved by applying the stabilizing positive bias to the second (or first) gate after the erasure.

2) Uniform distribution of the erased $V_{th}$ in an array is obtained by "write before erase" according to the present invention.

3) Long endurance is obtained by "limited voltage value erasure" according to the present invention.

While the invention has been particularly shown and described with reference to the preferred embodiments thereof, it will be understood by those skilled in the art that various changes in form and details may be made without departing from the spirit and scope of the invention.

What is claimed is:

1. A method of erasing a non-volatile memory wherein a memory cell of said non-volatile memory comprises:

a first channel forming semiconductor region in a surface of a substrate;

an opposite conductivity type region adjacent to said first channel forming semiconductor region and in said surface of said substrate;

a first gate insulator on said first channel forming semiconductor region;

a first conductive gate on said first gate insulator wherein carrier trap sites lie within said first gate insulator;

a second channel forming semiconductor region contacting said first channel forming semiconductor region in said surface of said substrate;

a second gate insulator on said second channel forming semiconductor region; and a second conductive gate on said second gate insulator wherein said second conductive gate is separated and insulated from said first conductive gate by an insulator;

wherein said method of erasing said non-volatile memory comprises:

injecting hot holes into said first gate insulator while negatively or zero biasing said first conductive gate and positively biasing said opposite conductivity region whereby hot holes are generated in a surface of said opposite conductivity region, wherein said positively biasing of said opposite conductivity region with respect to said first channel forming semiconductor region is larger in value than an electric barrier height against said hot holes wherein said electric barrier is formed at an interface between said first gate insulator and said opposite conductivity region; and positively biasing said first conductive gate to a voltage which generates an average electric field of more than 5 MV/cm in said first gate insulator.

2. The method according to claim 1 wherein said first and second gate insulators comprise an oxide/nitride/oxide triple layer.

3. The method according to claim 2 wherein said carrier trapping sites are generated in said nitride layer.

4. The method according to claim 2 wherein said carrier trapping sites are generated at an interface between said nitride and said oxide layers.

5. The method according to claim 2 wherein a bottom said oxide layer comprises nitrided silicon oxide.

6. The method according to claim 1 wherein said carrier trapping sites comprise small particles of conducting material buried in said first and second gate insulators.

7. A method of erasing a non-volatile memory array wherein a memory cell of said non-volatile memory array comprises:

a first channel forming semiconductor region in a surface of a substrate;

an opposite conductivity type region adjacent to said first channel forming semiconductor region and in said surface of said substrate;

a first gate insulator on said first channel forming semiconductor region;

a first conductive gate on said first gate insulator wherein carrier trap sites lie within said first gate insulator;

a second channel forming semiconductor region contacting said first channel forming semiconductor region in said surface of said substrate;

a second gate insulator on said second channel forming semiconductor region; and a second conductive gate on said second gate insulator wherein said second conductive gate is separated and insulated from said first conductive gate by an insulator;

wherein said method of erasing said non-volatile memory comprises:

injecting electrons into said first gate insulator wherein said electrons injected are trapped in said carrier trap sites; and injecting hot holes into said first gate insulator wherein said electrons are trapped in said carrier trap sites while applying a negative or zero bias to said first conductive gate and applying a positive bias to said opposite conductivity region.

8. The method according to claim 7 wherein said first and second gate insulators comprise an oxide/nitride/oxide triple layer.

9. The method according to claim 8 wherein said carrier trapping sites are generated in said nitride layer.

10. The method according to claim 9 wherein said carrier trapping sites are generated at an interface between said nitride and said oxide layers.

11. The method according to claim 9 wherein a bottom said oxide layer comprises nitrided silicon oxide.

12. The method according to claim 7 wherein said carrier trapping sites comprise small particles of conducting material buried in said first and second gate insulators.

13. A method of erasing a non-volatile memory wherein a memory cell of said non-volatile memory comprises:

a first channel forming semiconductor region in a surface of a substrate;

an opposite conductivity type region adjacent to said first channel forming semiconductor region and in said surface of said substrate;

a first gate insulator on said first channel forming semiconductor region;

a first conductive gate on said first gate insulator wherein carrier trap sites lie within said first gate insulator;

a second channel forming semiconductor region contacting said first channel forming semiconductor region in said surface of said substrate;

a second gate insulator on said second channel forming semiconductor region; and a second conductive gate on said second gate insulator wherein said second conductive gate is separated and insulated from said first conductive gate by an insulator;

wherein said method of erasing said non-volatile memory comprises:

injecting hot holes into said first gate insulator while applying a negative or zero bias to said first conductive gate and applying a positive bias to said opposite conductivity region wherein said positive bias is larger in value than an electric barrier height against said hot holes, wherein said electric barrier is formed at an interface between said first gate insulator and said opposite conductivity region and wherein a sum of absolute values of said positive bias and $\frac{2}{3}$ of said negative or zero bias is equal to or smaller than 6V wherein said negative or zero bias ranges from 0V to −5V.

14. The method according to claim 13 wherein said first and second gate insulators comprise an oxide/nitride/oxide triple layer.

15. The method according to claim 14 wherein said carrier trapping sites are generated in said nitride layer.

16. The method according to claim 14 wherein said carrier trapping sites are generated at an interface between said nitride and said oxide layers.

17. The method according to claim 14 wherein a bottom said oxide layer comprises nitrided silicon oxide.

18. The method according to claim 13 wherein said carrier trapping sites comprise small particles of conducting material buried in said first and second gate insulators.

19. A method of erasing a non-volatile memory wherein a memory cell of said non-volatile memory comprises:

a channel forming semiconductor region of one conductivity type in a surface of a substrate;

a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:

a first channel-forming region laterally contacting said first opposite conductivity region;

a second channel forming region contacting said second opposite conductivity region; and a third channel forming region in contact with said first and second channel forming regions and disposed between said first channel forming region and said second channel forming region;

a first gate insulator disposed on said first channel forming region and a part of said first opposite conductivity region adjacent to said first channel forming region;

a second gate insulator disposed on said second channel forming region and a part of said second opposite conductivity region adjacent to said second channel forming region;

a third gate insulator disposed on said third channel forming region;

a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator; and carrier trapping sites for carrier storage furnished in said first and second gate insulators;

wherein said method of erasing said non-volatile memory comprises:

injecting hot holes into said first gate insulator while negatively or zero biasing said first conductive gate and positively biasing said first opposite conductivity region whereby hot holes are generated in a surface of said first opposite conductivity region, wherein said positively biasing of said first opposite conductivity region with respect to said first channel forming semi conductor region is larger in value than an electric barrier height against said hot holes wherein said electric barrier is formed at an interface between said first gate insulator and said first opposite conductivity region; and positively biasing said first conductive gate to a voltage which generates an average electric field of more than 5 MV/cm in said first gate insulator.

20. The method according to claim 19 wherein said substrate comprises a semiconductor substrate.

21. The method according to claim 19 wherein said substrate comprises a silicon-on-insulator substrate.

22. The method according to claim 19 wherein a peak impurity concentration of said first and second channel forming regions is between about 5E17 and 4E18 atoms/cm$^3$.

23. The method according to claim 19 wherein a channel length of said first and second channel forming regions is between about 30 and 80 nm.

24. The method according to claim 19 wherein a peak impurity concentration of said third channel forming region is between about 5E17 and 1E18 atoms/cm$^3$.

25. The method according to claim 19 wherein a channel length of said third channel forming region is between about 60 and 260 nm.

26. The method according to claim 19 wherein said first and second gate insulators comprise an oxide/nitride/oxide triple layer.

27. The method according to claim 19 wherein said first and second gate insulators comprise:

a nitrided silicon oxide layer having a thickness of between about 3.6 and 7 nm;

a silicon nitride layer overlying said nitrided silicon oxide layer and having a thickness of between about 3 and 9 nm; and a silicon oxide layer overlying said silicon nitride layer and having a thickness of between about 4 and 8 nm.

28. The method according to claim 19 wherein said first and second gate insulators comprise:

a first silicon oxide layer having a thickness of between about 2.5 and 6 nm;

a silicon nitride layer overlying said first silicon oxide layer and having a thickness of between about 3 and 9 nm; and a second silicon oxide layer overlying said silicon nitride layer and having a thickness of between about 4 and 8 nm.

29. The method according to claim 19 wherein an impurity concentration of said first and second opposite conductivity regions under said first and second gate electrodes is between about 1E19 and 5E20 atoms/cm$^3$.

30. The method according to claim 19 wherein said insulator between said third gate electrode and said first and said second gate electrodes comprises silicon oxide.

31. The method according to claim 19 wherein said insulator between said third gate electrode and said first and said second gate electrodes comprises a triple layer of nitrided silicon oxide, silicon nitride, and silicon oxide.

32. The method according to claim 19 wherein:

voltages applied to said second and third conductive gates are positive, zero, or negative;

a voltage applied to said second opposite conductivity region is positive or zero; and an absolute value of all of said voltages is within a value so as not to alter a memory state and not to break said memory cell.

33. The method according to claim 19 further comprising erasing a memory state in said first gate insulator and in said second gate insulator at the same time by applying the same bias to both said first and second conductive gates and applying another same bias to both said first and second opposite conductivity type regions.

34. A method of erasing a non-volatile memory wherein a memory cell of said non-volatile memory comprises:

a channel forming semiconductor region of one conductivity type in a surface of a substrate;

a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:

a first channel-forming region laterally contacting said first opposite conductivity region;

a second channel forming region contacting said second opposite conductivity region; and a third channel forming region in contact with said first and second channel forming regions and disposed between said first channel forming region and said second channel forming region;

a first gate insulator disposed on said first channel forming region and a part of said first opposite conductivity region adjacent to said first channel forming region;

a second gate insulator disposed on said second channel forming region and a part of said second opposite conductivity region adjacent to said second channel forming region;

a third gate insulator disposed on said third channel forming region;

a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator; and carrier trapping sites for carrier storage furnished in said first and second gate insulators;

wherein said method of erasing said non-volatile memory comprises:

injecting electrons into said first gate insulator wherein said electrons injected are trapped in said carrier trap sites; and injecting hot holes into said first gate insulator wherein said electrons are trapped in said carrier trap sites while applying a negative or zero bias to said first conductive gate and applying a positive bias to said first opposite conductivity region.

35. The method according to claim 34 wherein said substrate comprises a semiconductor substrate.

36. The method according to claim 34 wherein said substrate comprises a silicon-on-insulator substrate.

37. The method according to claim 34 wherein a peak impurity concentration of said first and second channel forming regions is between about 5E17 and 4E18 atoms/$cm^3$.

38. The method according to claim 34 wherein a channel length of said first and second channel forming regions is between about 30 and 80 nm.

39. The method according to claim 34 wherein a peak impurity concentration of said third channel forming region is between about 5E17 and 1E18 atoms/$cm^3$.

40. The method according to claim 34 wherein a channel length of said third channel forming region is between about 60 and 260 nm.

41. The method according to claim 34 wherein said first and second gate insulators comprise an oxide/nitride/oxide triple layer.

42. The method according to claim 34 wherein said first and second gate insulators comprise:

a nitrided silicon oxide layer having a thickness of between about 3.6 and 7 nm;

a silicon nitride layer overlying said nitrided silicon oxide layer and having a thickness of between about 3 and 9 nm; and a silicon oxide layer overlying said silicon nitride layer and having a thickness of between about 4 and 8 nm.

43. The method according to claim 34 wherein said first and second gate insulators comprise:

a first silicon oxide layer having a thickness of between about 2.5 and 6 nm;

a silicon nitride layer overlying said first silicon oxide layer and having a thickness of between about 3 and 9 nm; and a second silicon oxide layer overlying said silicon nitride layer and having a thickness of between about 4 and 8 nm.

44. The method according to claim 34 wherein an impurity concentration of said first and second opposite conductivity regions under said first and second gate electrodes is between about 1E19 and 5E20 atoms/$cm^3$.

45. The method according to claim 34 wherein said insulator between said third gate electrode and said first and said second gate electrodes comprises silicon oxide.

46. The method according to claim 34 wherein said insulator between said third gate electrode and said first and said second gate electrodes comprises a triple layer of nitrided silicon oxide, silicon nitride, and silicon oxide.

47. The method according to claim 34 wherein:

voltages applied to said second and third conductive gates are positive, zero, or negative;

a voltage applied to said second opposite conductivity region is positive or zero; and an absolute value of all of said voltages is within a value so as not to alter a memory state and not to break said memory cell.

48. The method according to claim 34 further comprising erasing a memory state in said first gate insulator and in said second gate insulator at the same time by applying the same bias to both said first and second conductive gates and applying another same bias to both said first and second opposite conductivity type regions.

49. The method according to claim 34 wherein said electrons are supplied to a first channel induced in said first channel forming region from said second opposite conductivity type region through a second channel induced in a surface of said second channel forming region and a third channel induced in a surface of said third channel forming region wherein said first, second, and third channels are electrically induced in respective surfaces of said first, second, and third channel forming semiconductor regions by applying a bias larger than each respective gate threshold voltage to said first, second, and third gate electrodes.

50. A method of erasing a non-volatile memory wherein a memory cell of said non-volatile memory comprises:

a channel forming semiconductor region of one conductivity type in a surface of a substrate;

a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:

a first channel-forming region laterally contacting said first opposite conductivity region;

a second channel forming region contacting said second opposite conductivity region; and a third channel forming region in contact with said first and second channel forming regions and disposed between said first channel forming region and said second channel forming region;

a first gate insulator disposed on said first channel forming region and a part of said first opposite conductivity region adjacent to said first channel forming region;

a second gate insulator disposed on said second channel forming region and a part of said second opposite conductivity region adjacent to said second channel forming region;

a third gate insulator disposed on said third channel forming region;

a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator, and carrier trapping sites for carrier storage furnished in said first and second gate insulators;

wherein said method of erasing said non-volatile memory comprises:

injecting hot holes into said first gate insulator while applying a negative or zero bias to said first conductive gate and applying a positive bias to said first opposite conductivity region wherein said positive bias is larger in value than an electric barrier height against said hot holes wherein said electric barrier is formed at an interface between said first gate insulator and said first opposite conductivity region and wherein a sum of absolute values of said positive bias and ⅔ of said negative or zero bias is equal to or smaller than 6V wherein said negative or zero bias ranges from 0V to −5V.

51. The method according to claim 50 wherein said substrate comprises a semiconductor substrate.

52. The method according to claim 50 wherein said substrate comprises a silicon-on-insulator substrate.

53. The method according to claim 50 wherein a peak impurity concentration of said first and second channel forming regions is between about 5E17 and 4E18 atoms/cm$^3$.

54. The method according to claim 50 wherein a channel length of said first and second channel forming regions is between about 30 and 80 nm.

55. The method according to claim 50 wherein a peak impurity concentration of said third channel forming region is between about 5E17 and 1E18 atoms/cm$^3$.

56. The method according to claim 50 wherein a channel length of said third channel forming region is between about 60 and 260 nm.

57. The method according to claim 50 wherein said first and second gate insulators comprise an oxide/nitride/oxide triple layer.

58. The method according to claim 50 wherein said first and second gate insulators comprise:

a nitrided silicon oxide layer having a thickness of between about 3.6 and 7 nm;

a silicon nitride layer overlying said nitrided silicon oxide layer and having a thickness of between about 3 and 9 nm; and a silicon oxide layer overlying said silicon nitride layer and having a thickness of between about 4 and 8 nm.

59. The method according to claim 50 wherein said first and second gate insulators comprise:

a first silicon oxide layer having a thickness of between about 2.5 and 6 nm;

a silicon nitride layer overlying said first silicon oxide layer and having a thickness of between about 3 and 9 nm; and a second silicon oxide layer overlying said silicon nitride layer and having a thickness of between about 4 and 8 nm.

60. The method according to claim 50 wherein an impurity concentration of said first and second opposite conductivity regions under said first and second gate electrodes is between about 1E19 and 5E20 atoms/cm$^3$.

61. The method according to claim 50 wherein said insulator between said third gate electrode and said first and said second gate electrodes comprises silicon oxide.

62. The method according to claim 50 wherein said insulator between said third gate electrode and said first and said second gate electrodes comprises a triple layer of nitrided silicon oxide, silicon nitride, and silicon oxide.

63. The method according to claim 50 wherein:

voltages applied to said second and third conductive gates are positive, zero, or negative;

a voltage applied to said second opposite conductivity region is positive or zero; and an absolute value of all of said voltages is within a value so as not to alter a memory state and not to break said memory cell.

64. The method according to claim 50 further comprising erasing a memory state in said first gate insulator and in said second gate insulator at the same time by applying the same bias to both said first and second conductive gates and applying another same bias to both said first and second opposite conductivity type regions.

65. A method of erasing a non-volatile memory wherein a memory cell of said non-volatile memory comprises:

a channel forming semiconductor region of one conductivity type in a surface of a substrate;

a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:

a first channel-forming region laterally contacting said first opposite conductivity region, a second channel forming region contacting said second opposite conductivity region; and a third channel forming region in contact with said first and second channel forming regions and disposed between said first channel forming region and said second channel forming region;

a first gate insulator disposed on said first channel forming region and a part of said first opposite conductivity region adjacent to said first channel forming region;

a second gate insulator disposed on said second channel forming region and a part of said second opposite conductivity region adjacent to said second channel forming region;

a third gate insulator disposed on said third channel forming region;

a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator; and carrier trapping sites for carrier storage furnished in said first and second gate insulators;

wherein said method of erasing said non-volatile memory comprises:
  injecting hot holes into said second gate insulator while negatively or zero biasing said second conductive gate and positively biasing said second opposite conductivity region whereby hot holes are generated in a surface of said second opposite conductivity region, wherein said positively biasing of said second opposite conductivity region with respect to said second channel forming semiconductor region is larger in value than an electric barrier height against said hot holes wherein said electric barrier is formed at an interface between said second gate insulator and said second opposite conductivity region; and
  positively biasing said second conductive gate to a voltage which generates an average electric field of more than 5 MV/cm in said second gate insulator.

66. The method according to claim 65 wherein said substrate comprises a semiconductor substrate.

67. The method according to claim 65 wherein said substrate comprises a silicon-on-insulator substrate.

68. The method according to claim 65 wherein a peak impurity concentration of said first and second channel forming regions is between about 5E17 and 4E18 atoms/cm$^3$.

69. The method according to claim 65 wherein a channel length of said first and second channel forming regions is between about 30 and 80 nm.

70. The method according to claim 65 wherein a peak impurity concentration of said third channel forming region is between about 5E17 and 1E18 atoms/cm$^3$.

71. The method according to claim 65 wherein a channel length of said third channel forming region is between about 60 and 260 nm.

72. The method according to claim 65 wherein said first and second gate insulators comprise an oxide/nitride/oxide triple layer.

73. The method according to claim 65 wherein said first and second gate insulators comprise:
  a nitrided silicon oxide layer having a thickness of between about 3.6 and 7 nm;
  a silicon nitride layer overlying said nitrided silicon oxide layer and having a thickness of between about 3 and 9 nm; and
  a silicon oxide layer overlying said silicon nitride layer and having a thickness of between about 4 and 8 nm.

74. The method according to claim 65 wherein said first and second gate insulators comprise:
  a first silicon oxide layer having a thickness of between about 2.5 and 6 nm;
  a silicon nitride layer overlying said first silicon oxide layer and having a thickness of between about 3 and 9 nm; and
  a second silicon oxide layer overlying said silicon nitride layer and having a thickness of between about 4 and 8 nm.

75. The method according to claim 65 wherein an impurity concentration of said first and second opposite conductivity regions under said first and second gate electrodes is between about 1E19 and 5E20 atoms/cm$^3$.

76. The method according to claim 65 wherein said insulator between said third gate electrode and said first and said second gate electrodes comprises silicon oxide.

77. The method according to claim 65 wherein said insulator between said third gate electrode and said first and said second gate electrodes comprises a triple layer of nitrided silicon oxide, silicon nitride, and silicon oxide.

78. The method according to claim 65 wherein:
  voltages applied to said first and third conductive gates are positive, zero, or negative;
  a voltage applied to said first opposite conductivity region is positive or zero; and
  an absolute value of all of said voltages is within a value so as not to alter a memory state and not to break said memory cell.

79. The method according to claim 65 further comprising erasing a memory state in said first gate insulator and in said second gate insulator at the same time by applying the same bias to both said first and second conductive gates and applying another same bias to both said first and second opposite conductivity type regions.

80. A method of erasing a non-volatile memory wherein a memory cell of said non-volatile memory comprises:
  a channel forming semiconductor region of one conductivity type in a surface of a substrate;
  a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:
    a first channel-forming region laterally contacting said first opposite conductivity region;
    a second channel forming region contacting said second opposite conductivity region; and
    a third channel forming region in contact with said first and second channel forming regions and disposed between said first channel forming region and said second channel forming region;
  a first gate insulator disposed on said first channel forming region and a part of said first opposite conductivity region adjacent to said first channel forming region;
  a second gate insulator disposed on said second channel forming region and a part of said second opposite conductivity region adjacent to said second channel forming region;
  a third gate insulator disposed on said third channel forming region;
  a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator; and
  carrier trapping sites for carrier storage furnished in said first and second gate insulators;
  wherein said method of erasing said non-volatile memory comprises:
    injecting electrons into said second gate insulator wherein said electrons injected are trapped in said carrier trap sites; and
    injecting hot holes into said second gate insulator wherein said electrons are trapped in said carrier trap sites while applying a negative or zero bias to said second conductive gate and applying a positive bias to said second opposite conductivity region.

81. The method according to claim 80 wherein said substrate comprises a semiconductor substrate.

82. The method according to claim 80 wherein said substrate comprises a silicon-on-insulator substrate.

83. The method according to claim 80 wherein a peak impurity concentration of said first and second channel forming regions is between about 5E17 and 4E18 atoms/cm$^3$.

84. The method according to claim 80 wherein a channel length of said first and second channel forming regions is between about 30 and 80 nm.

85. The method according to claim 80 wherein a peak impurity concentration of said third channel forming region is between about 5E17 and 1E18 atoms/cm$^3$.

86. The method according to claim 80 wherein a channel length of said third channel forming region is between about 60 and 260 nm.

87. The method according to claim 80 wherein said first and second gate insulators comprise an oxide/nitride/oxide triple layer.

88. The method according to claim 80 wherein said first and second gate insulators comprise:
- a nitrided silicon oxide layer having a thickness of between about 3.6 and 7 nm;
- a silicon nitride layer overlying said nitrided silicon oxide layer and having a thickness of between about 3 and 9 nm; and
- a silicon oxide layer overlying said silicon nitride layer and having a thickness of between about 4 and 8 nm.

89. The method according to claim 80 wherein said first and second gate insulators comprise:
- a first silicon oxide layer having a thickness of between about 2.5 and 6 nm;
- a silicon nitride layer overlying said first silicon oxide layer and having a thickness of between about 3 and 9 nm; and
- a second silicon oxide layer overlying said silicon nitride layer and having a thickness of between about 4 and 8 nm.

90. The method according to claim 80 wherein an impurity concentration of said first and second opposite conductivity regions under said first and second gate electrodes is between about 1E19 and 5E20 atoms/cm$^3$.

91. The method according to claim 80 wherein said insulator between said third gate electrode and said first and said second gate electrodes comprises silicon oxide.

92. The method according to claim 80 wherein said insulator between said third gate electrode and said first and said second gate electrodes comprises a triple layer of nitrided silicon oxide, silicon nitride, and silicon oxide.

93. The method according to claim 80 wherein:
- voltages applied to said second and third conductive gates are positive, zero, or negative;
- a voltage applied to said second opposite conductivity region is positive or zero; and
- an absolute value of all of said voltages is within a value so as not to alter a memory state and not to break said memory cell.

94. The method according to claim 80 further comprising erasing a memory state in said first gate insulator and in said second gate insulator at the same time by applying the same bias to both said first and second conductive gates and applying another same bias to both said first and second opposite conductivity type regions.

95. The method according to claim 80 wherein said electrons are supplied to a first channel induced in said first channel forming region from said second opposite conductivity type region through a second channel induced in a surface of said second channel forming region and a third channel induced in a surface of said third channel forming region wherein said first, second, and third channels are electrically induced in respective surfaces of said first, second, and third channel forming semiconductor regions by applying a bias larger than each respective gate threshold voltage to said first, second, and third gate electrodes.

96. A method of erasing a non-volatile memory wherein a memory cell of said non-volatile memory comprises:
- a channel forming semiconductor region of one conductivity type in a surface of a substrate;
- a first opposite conductivity region and a second opposite conductivity region disposed in a surface of said substrate wherein said first and second opposite conductivity regions are spaced apart and separated from each other by said channel forming semiconductor region and wherein said channel forming semiconductor region comprises:
  - a first channel-forming region laterally contacting said first opposite conductivity region;
  - a second channel forming region contacting said second opposite conductivity region; and
  - a third channel forming region in contact with said first and second channel forming regions and disposed between said first channel forming region and said second channel forming region;
- a first gate insulator disposed on said first channel forming region and a part of said first opposite conductivity region adjacent to said first channel forming region;
- a second gate insulator disposed on said second channel forming region and a part of said second opposite conductivity region adjacent to said second channel forming region;
- a third gate insulator disposed on said third channel forming region;
- a first gate electrode on said first gate insulator, a second gate electrode on said second gate insulator, and a third gate electrode on said third gate insulator wherein said first, second, and third gate electrodes are electrically insulated from each other and wherein a part of said first gate overlaps a part of said first opposite conductivity region via said first gate insulator and a part of said second gate overlaps a part of said second opposite conductivity region via said second gate insulator; and
- carrier trapping sites for carrier storage furnished in said first and second gate insulators;

wherein said method of erasing said non-volatile memory comprises:
- injecting hot holes into said second gate insulator while applying a negative or zero bias to said second conductive gate and applying a positive bias to said second opposite conductivity region wherein said positive bias is larger in value than an electric barrier height against said hot holes wherein said electric barrier is formed at an interface between said second gate insulator and said second opposite conductivity region and wherein a sum of absolute values of said positive bias and ⅔ of said negative or zero bias is equal to or smaller than 6V wherein said negative or zero bias ranges from 0V to −5V.

97. The method according to claim 96 wherein said substrate comprises a semiconductor substrate.

98. The method according to claim 96 wherein said substrate comprises a silicon-on-insulator substrate.

99. The method according to claim 96 wherein a peak impurity concentration of said first and second channel forming regions is between about 5E17 and 4E18 atoms/cm$^3$.

100. The method according to claim 96 wherein a channel length of said first and second channel forming regions is between about 30 and 80 nm.

101. The method according to claim 96 wherein a peak impurity concentration of said third channel forming region is between about 5E17 and 1E18 atoms/cm$^3$.

102. The method according to claim 96 wherein a channel length of said third channel forming region is between about 60 and 260 nm.

103. The method according to claim 96 wherein said first and second gate insulators comprise an oxide/nitride/oxide triple layer.

104. The method according to claim 96 wherein said first and second gate insulators comprise:
   a nitrided silicon oxide layer having a thickness of between about 3.6 and 7 nm;
   a silicon nitride layer overlying said nitrided silicon oxide layer and having a thickness of between about 3 and 9 nm; and
   a silicon oxide layer overlying said silicon nitride layer and having a thickness of between about 4 and 8 nm.

105. The method according to claim 96 wherein said first and second gate insulators comprise:
   a first silicon oxide layer having a thickness of between about 2.5 and 6 nm;
   a silicon nitride layer overlying said first silicon oxide layer and having a thickness of between about 3 and 9 nm; and
   a second silicon oxide layer overlying said silicon nitride layer and having a thickness of between about 4 and 8 nm.

106. The method according to claim 96 wherein an impurity concentration of said first and second opposite conductivity regions under said first and second gate electrodes is between about 1E19 and 5E20 atoms/cm$^3$.

107. The method according to claim 96 wherein said insulator between said third gate electrode and said first and said second gate electrodes comprises silicon oxide.

108. The method according to claim 96 wherein said insulator between said third gate electrode and said first and said second gate electrodes comprises a triple layer of nitrided silicon oxide, silicon nitride, and silicon oxide.

109. The method according to claim 96 wherein:
   voltages applied to said second and third conductive gates are positive, zero, or negative;
   a voltage applied to said second opposite conductivity region is positive or zero; and
   an absolute value of all of said voltages is within a value so as not to alter a memory state and not to break said memory cell.

110. The method according to claim 96 further comprising erasing a memory state in said first gate insulator and in said second gate insulator at the same time by applying the same bias to both said first and second conductive gates and applying another same bias to both said first and second opposite conductivity type regions.

111. A memory cell of a non-volatile memory array comprising:
   a channel forming semiconductor region in a surface of substrate;
   an opposite conductivity type region adjacent to said channel forming semiconductor region and in said surface of said substrate;
   a gate insulator on said channel forming semiconductor region; and
   a conductive gate on said gate insulator wherein carrier trap sites lie within said gate insulator;
   wherein said non-volatile memory cell is erased by the method comprising:
      injecting electrons into said first gate insulator wherein said electrons injected are trapped in said carrier trap sites; and
      injecting hot holes into said gate insulator wherein said electrons are trapped in said carrier trap sites while applying a negative or zero bias to said conductive gate and applying a positive bias to said opposite conductivity region.

112. A memory cell of a non-volatile memory array comprising:
   a channel forming semiconductor region in a surface of a substrate;
   an opposite conductivity type region adjacent to said channel forming semiconductor region and in said surface of said substrate;
   a gate insulator on said channel forming semiconductor region; and
   a conductive gate on said gate insulator wherein carrier trap sites lie within said gate insulator;
   wherein said non-volatile memory cell is erased by the method comprising:
      injecting hot holes into said gate insulator while negatively or zero biasing said conductive gate and positively biasing said opposite conductivity region whereby hot holes are generated in a surface of said opposite conductivity region, wherein said positively biasing of said opposite conductivity region with respect to said channel forming semiconductor region is larger in value than an electric barrier height against said hot holes wherein said electric barrier is formed at an interface between said gate insulator and said opposite conductivity region; and
      positively biasing said conductive gate to a voltage which generates an average electric field of more than 5 MV/cm in said gate insulator.

113. A memory cell of a non-volatile memory array comprising:
   a channel forming semiconductor region in a surface of a substrate;
   an opposite conductivity type region adjacent to said channel forming semiconductor region and in said surface of said substrate;
   a gate insulator on said channel forming semiconductor region; and
   a conductive gate on said gate insulator wherein carrier trap sites lie within said gate insulator;
   wherein said non-volatile memory cell is erased by the method comprising:
      injecting hot holes into said gate insulator while applying a negative or zero bias to said conductive gate and applying a positive bias to said opposite conductivity region wherein said positive bias is larger in value than an electric barrier height against said hot holes, wherein said electric barrier is formed at an interface between said gate insulator and said opposite conductivity region and wherein a sum of absolute values of said positive bias and $\frac{2}{5}$ of said negative or zero bias is equal to or smaller than 6V wherein said negative or zero bias ranges from 0V to −5V.

* * * * *

UNITED STATES PATENT AND TRADEMARK OFFICE
CERTIFICATE OF CORRECTION

PATENT NO.    : 6,418,062 B1
DATED         : July 9, 2002
INVENTOR(S)   : Yutaka Hayashi, Seiki Ogura and Tomoya Saito It is certified that error appears in the above-identified patent and that said Letters Patent is hereby corrected as shown below:

<u>Title page,</u>
Item [73], delete "Halo LSI, Inc., Wapperings Falls, NY (US)" and replace with
-- Halo, Inc., Wappingers Falls, NY (US) --.

Signed and Sealed this

Eighteenth Day of February, 2003

JAMES E. ROGAN
*Director of the United States Patent and Trademark Office*